United States Patent
Reeder

(10) Patent No.: US 11,777,113 B2
(45) Date of Patent: Oct. 3, 2023

(54) WASTE HEAT RECLAMATION IN A POWER GENERATION SYSTEM AND METHOD OF OPERATING A POWER GENERATION SYSTEM

(71) Applicant: Toyota Motor Engineering & Manufacturing North America, Inc, Plano, TX (US)

(72) Inventor: Zach Reeder, Cynthiana, KY (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 3 days.

(21) Appl. No.: 17/502,191

(22) Filed: Oct. 15, 2021

(65) Prior Publication Data

US 2023/0121336 A1 Apr. 20, 2023

(51) Int. Cl.
| | |
|---|---|
| *H01M 8/04007* | (2016.01) |
| *H01M 8/04029* | (2016.01) |
| *H01M 8/04089* | (2016.01) |
| *H01M 8/04701* | (2016.01) |
| *H01M 8/04082* | (2016.01) |
| *H10N 10/17* | (2023.01) |

(52) U.S. Cl.
CPC ..... *H01M 8/04067* (2013.01); *H01M 8/04029* (2013.01); *H01M 8/04089* (2013.01); *H01M 8/04201* (2013.01); *H01M 8/04701* (2013.01); *H10N 10/17* (2023.02); *H01M 2250/20* (2013.01); *H01M 2250/402* (2013.01)

(58) Field of Classification Search
CPC .......... H01M 8/04067; H01M 8/04029; H01M 8/04089; H01M 8/04201; H01M 8/04701; H01M 8/04007; H01M 8/04014; H01M 8/04037; H01M 8/04074; H01M 8/04388; H01M 8/04395; H01M 8/04373; H01M 8/04358; H01M 8/04567; H01M 8/04656; H01M 8/04708; H01M 8/04723; H01M 8/04738; H01M 8/04753; H01M 8/04888; H01M 8/04953; H01M 2250/402; H01M 2250/20; H01M 16/003; H01L 35/32
See application file for complete search history.

(56) References Cited

U.S. PATENT DOCUMENTS

| | | | |
|---|---|---|---|
| 5,753,383 A | 5/1998 | Cargnelli et al. | |
| 8,288,042 B2 | 10/2012 | Uchiyama | |
| 2005/0112436 A1* | 5/2005 | Jeffcoate | H01M 8/04007 429/495 |
| 2007/0196702 A1* | 8/2007 | Sridhar et al. | C25B 1/02 429/421 |
| 2015/0243866 A1* | 8/2015 | Iriyama | H01L 35/02 60/320 |
| 2020/0212459 A1 | 7/2020 | Ballantine et al. | |

FOREIGN PATENT DOCUMENTS

| | | |
|---|---|---|
| CN | 206422191 U | 8/2017 |
| CN | 112820896 A | 5/2021 |
| KR | 100965715 B1 | 6/2010 |
| WO | 2015036082 A1 | 3/2015 |

* cited by examiner

*Primary Examiner* — Matthew W Van Oudenaren
(74) *Attorney, Agent, or Firm* — Jordan IP Law, LLC

(57) ABSTRACT

A system includes a power generator to generate power from an reaction involving a first fuel reactant and a second fuel reactant, a fuel reactant supply source to supply the first fuel reactant to the power generator via a fuel supply line having a fuel expansion region, a radiant fluid circuit for circulation of a radiant fluid configured to cool the power generator, and one or more thermoelectric generators in thermal contact with the fuel expansion region and the radiant fluid circuit downstream of the fuel cell to generate electric power via a Seebeck effect using at least a portion of the waste heat generated by the power generator.

15 Claims, 11 Drawing Sheets

WASTE HEAT RECLAMATION IN A POWER GENERATION SYSTEM AND METHOD OF OPERATING A POWER GENERATION SYSTEM

TECHNICAL FIELD

Embodiments relate generally to one or more power generation systems that include a power generator to generate power from a reaction involving a first fuel reactant, a fuel reactant supply source to supply the first fuel reactant to the power generator via a fuel supply line having a fuel expansion region, a radiant fluid circuit for circulation of a radiant fluid configured to cool the power generator, and one or more thermoelectric generators in thermal contact with the fuel expansion region and the radiant fluid circuit downstream of the power generator to generate electric power via a Seebeck effect using at least a portion of the waste heat generated by the power generator.

BACKGROUND

Contemporary systems generally include one or more fuel cell modules comprising one or more fuel cells arranged in a stack formation. Each fuel cell in the stack having a structure in the form of a membrane electrode assembly (MEA) that may comprise an electrolyte membrane (e.g., a polymer electrolyte membrane) interposed between a first electrode (e.g., an anode) and a second electrode (e.g., a cathode). In operation, a first fuel reactant, for example, hydrogen ($H_2$), is supplied to the anode, while a second fuel reactant, for example, oxygen ($O_2$) is supplied via a stream of compressed air, is supplied to the cathode. The resultant exothermic reaction produces waste heat that is removed via a heat exchange device.

BRIEF SUMMARY

Embodiments relate to one or more power generation systems that enhance the overall operational performance of a power generator such as, for example, a fuel cell or a hydrogen-powered internal combustion engine, by providing one or more thermoelectric generators (TEGs) that utilizes waste heat generated by the power generator to concurrently generate electric power (i.e., electric voltage or electric current) via a Seebeck effect concurrently with the generation of power (i.e., electric and/or mechanical) by the power generator. The TEG(s) provide enhanced operational performance of the system by facilitating enhanced thermal management thereto.

In accordance with one or more embodiments, a power generation system comprises one or more of the following: a power generator to generate power based on a reaction of a first fuel reactant and a second fuel reactant; a first fuel reactant supply source to supply the first fuel reactant to the fuel cell via a fuel supply line having a fuel expansion region; a radiant fluid circuit for circulation of a radiant fluid configured to cool the power generator; and one or more thermoelectric generators in thermal contact with the fuel expansion region and the radiant fluid circuit downstream of the power generator to generate electric power via a Seebeck effect using waste heat generated by the power generator.

In accordance with one or more embodiments, a power generation system comprises one or more of the following: a fuel cell, a first fuel reactant supply source, a radiant fluid circuit, and one or more TEGs. The fuel cell comprises a hydrogen fuel cell to generate electric power from an electrochemical reaction of a first fuel reactant comprising hydrogen ($H_2$) and a second fuel reactant comprising oxygen ($O_2$). The first fuel reactant supply source is configured to supply the first fuel reactant to the fuel cell via a fuel supply line having a fuel expansion region. The radiant fluid circuit facilitates circulation of a radiant fluid configured to cool the fuel cell. The one or more TEGs are in thermal contact with the fuel expansion region and the radiant fluid circuit downstream of the fuel cell to generate electric power via a Seebeck effect using waste heat generated by the fuel cell and absorbed by the radiant fluid.

In accordance with one or more embodiments, a power generation system comprises one or more of the following: an internal combustion engine (ICE) to generate mechanical power based on a chemical reaction of a first fuel reactant comprising hydrogen ($H_2$) and a second fuel reactant comprising oxygen ($O_2$); a first fuel reactant supply source to supply the first fuel reactant to the ICE via a fuel supply line having a fuel expansion region; a radiant fluid circuit for circulation of a radiant fluid configured to cool the ICE; and one or more thermoelectric generators in thermal contact with the fuel expansion region and the radiant fluid circuit downstream of the ICE to generate electric power via a Seebeck effect using waste heat generated by the ICE.

In accordance with one or more embodiments, a vehicle comprises one or more of the following: a system that includes: a power generator to generate power based on a reaction of a first fuel reactant and a second fuel reactant; a first fuel reactant supply source to supply the first fuel reactant to the power generator via a fuel supply line having a fuel expansion region; a radiant fluid circuit for circulation of a radiant fluid configured to cool the power generator; and one or more thermoelectric generators in thermal contact with the fuel expansion region and the radiant fluid circuit downstream of the power generator to generate electric power via a Seebeck effect using waste heat generated by the power generator.

In accordance with one or more embodiments, a vehicle comprises one or more of the following: an electric motor to drive the vehicle, and a system to supply electric power to the electric motor. The system comprises one or more of the following: a fuel cell, a first fuel reactant supply source, a radiant fluid circuit, and one or more TEGs. The fuel cell comprises a hydrogen fuel cell to generate electric power from an electrochemical reaction of a first fuel reactant comprising hydrogen ($H_2$) fuel and a second fuel reactant comprising oxygen ($O_2$). The first fuel reactant supply source is configured to supply the first fuel reactant to the fuel cell via a fuel supply line having a fuel expansion region. The radiant fluid circuit facilitates circulation of a radiant fluid configured to cool the fuel cell. The one or more TEGs are in thermal contact with the fuel expansion region and the radiant fluid circuit downstream of the fuel cell to generate electric power via a Seebeck effect using waste heat generated by the fuel cell and absorbed by the radiant fluid.

In accordance with one or more embodiments, a vehicle comprises one or more of the following: a power generation system that includes: an ICE to generate mechanical power based on a chemical reaction of a first fuel reactant comprising hydrogen ($H_2$) and a second fuel reactant comprising oxygen ($O_2$); a first fuel reactant supply source to supply the first fuel reactant to the ICE via a fuel supply line having a fuel expansion region; a radiant fluid circuit for circulation of a radiant fluid configured to cool the ICE; and one or more thermoelectric generators in thermal contact with the fuel expansion region and the radiant fluid circuit downstream of the ICE to generate electric power via a Seebeck effect using waste heat generated by the ICE.

In accordance with one or more embodiments, a method of operating a power generation system that includes a power generator, a first fuel reactant supply source, a fuel supply line having a fuel expansion region, one or more thermoelectric generators, and a radiant fluid circuit, the method comprising one or more of the following: generating power by the power generator via a reaction of a first fuel reactant and a second fuel reactant, the first fuel reactant being supplied by the first fuel reactant supply source via the fuel supply line; and generating electric power, via a Seebeck effect, using waste heat produced by the power generator by placing the one or more thermoelectric generators in thermal contact with the fuel expansion region and the radiant fluid circuit downstream of the power generator.

In accordance with one or more embodiments, a method of operating a power generation system that includes a fuel cell, a first fuel reactant supply source, a fuel supply line having a fuel expansion region, one or more thermoelectric generators, and a radiant fluid circuit, the method comprising one or more of the following: generating electric power by the fuel cell via a electrochemical reaction of a first fuel reactant and a second fuel reactant, the first fuel reactant being supplied by the first fuel reactant supply source via the fuel supply line; and generating electric power, via a Seebeck effect, using waste heat produced by the fuel cell by placing the one or more thermoelectric generators in thermal contact with the fuel expansion region and the radiant fluid circuit downstream of the fuel cell.

In accordance with one or more embodiments, a method of operating a power generation system that includes an ICE, a first fuel reactant supply source, a fuel supply line having a fuel expansion region, one or more thermoelectric generators, and a radiant fluid circuit, the method comprising one or more of the following: generating electric power by the ICE via a electrochemical reaction of a first fuel reactant and a second fuel reactant, the first fuel reactant being supplied by the first fuel reactant supply source via the fuel supply line; and generating electric power, via a Seebeck effect, using waste heat produced by the ICE by placing the one or more thermoelectric generators in thermal contact with the fuel expansion region and the radiant fluid circuit downstream of the ICE.

BRIEF DESCRIPTION OF THE SEVERAL VIEWS OF THE DRAWINGS

The various advantages of the one or more embodiments will become apparent to one skilled in the art by reading the following specification and appended claims, and by referencing the following drawings, in which:

DETAILED DESCRIPTION

Figure 1:
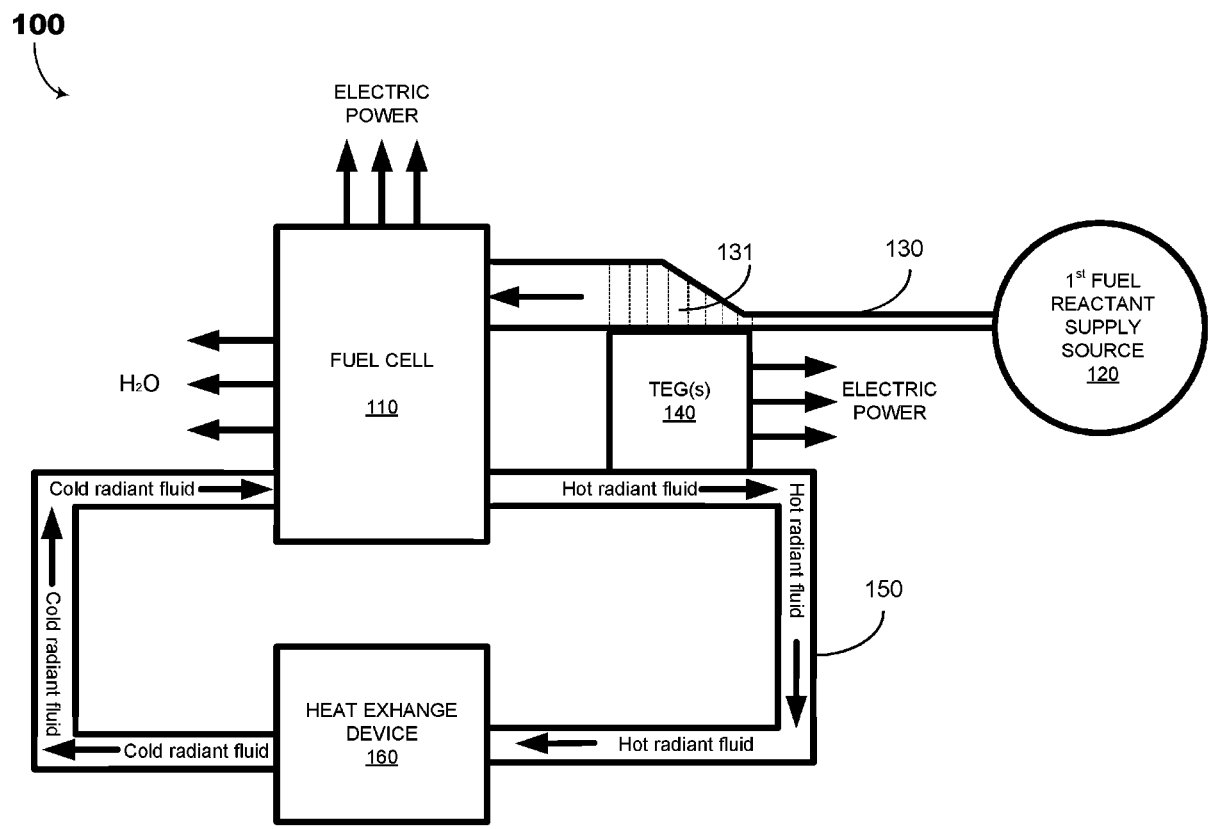
FIG. 1 illustrates a power generation system, in accordance with one or more embodiments shown and described herein.

FIG. 1 illustrates an example power generation system 100 in accordance with one or more embodiments set forth, described, and/or illustrated herein. The illustrated example power generation system 100 may have mobility applications such as, for example, an electric vehicle (EV), to include airborne electric vehicles, seaborne electric vehicles, electrically-powered spacecraft, and ground vehicles (e.g., hybrid electric vehicles (HEV), plug-in hybrid electric vehicles (PHEV), battery electric vehicles (BEV), fuel cell electric vehicles (FCEV), and railborne electric vehicles (REV)). Although the example power generation system 100 may be implemented for such mobility applications, embodiments are not limited thereto, and thus, this disclosure contemplates that the power generation system 100 may be implemented in non-mobility or stationary applications such as, for example, industrial power generation systems or residential power generation systems.

The example power generation system 100 comprises a fuel cell 110, a first fuel reactant supply source 120, and one or more TEGs 140. In accordance with one or more embodiments set forth, described, and/or illustrated herein, the fuel cell 110 may comprise a hydrogen fuel cell to generate electric power (i.e., electric voltage or electric current) from an electrochemical reaction of a first fuel reactant comprising hydrogen ($H_2$) and a second fuel reactant comprising oxygen ($O_2$). The fuel cell 110 may form part of a fuel cell module having a plurality of fuel cells arranged in a stack formation, each fuel cell 110 in the stack having a structure in the form of a membrane electrode assembly (MEA) that comprises an electrolyte membrane (e.g., a polymer electrolyte membrane) interposed between a first electrode (e.g., an anode) and a second electrode (e.g., a cathode). In operation, the first fuel reactant is supplied to the anode, while the second fuel reactant is supplied to the cathode via a stream of compressed air. The resultant exothermic reaction produces electric power to be supplied to one or more electric power sources, with heat and water ($H_2O$) as byproducts.

The first fuel reactant supply source 120 is configured to supply the hydrogen to the fuel cell 110 via a fuel supply line 130 having a fuel expansion region 131 (See, hatched lines). In accordance with one or more embodiments set forth, described, and/or illustrated herein, the first fuel reactant supply source 120 may comprise a hydrogen tank which stores liquid or gaseous hydrogen, and one or more controllable valves for controlling the metering of hydrogen from the hydrogen tank to the fuel cell 110. In accordance with one example embodiment, the fuel expansion region 131 comprises a liquid-to-gas (L2G) expansion region for expansion of liquid hydrogen to form hydrogen gas to be supplied to the fuel cell 110. Alternatively, in accordance with one example embodiment, the fuel expansion region 131 comprises a high-pressure (HP) gas-to-low-pressure (LP) gas (HP2LP) expansion region for expansion of HP hydrogen gas into LP hydrogen gas to be supplied to the fuel cell 110.

The power generation system 100 may also comprise a radiant fluid circuit 150 for circulation of a radiant fluid configured to cool the fuel cell 110. In the radiant fluid circuit 150, the radiant fluid downstream of the fuel cell 110 that has absorbed or extracted heat from the fuel cell 110 flows out of the fuel cell 110 where it flows through a heat exchanger device 160 arranged downstream of the fuel cell 110 and the one or more TEGs 140. The heat exchanger device 160 is configured to thermally contact the hot radiant fluid for purposes of cooling (i.e., reducing the temperature) the radiant fluid having residual waste heat not absorbed by the TEGs 140 prior to return entry into the fuel cell 110. In accordance with one or more embodiments set forth, described, and/or illustrated herein, the heat exchanger device 160 comprises a radiator. Embodiments, however, are not limited thereto, and thus, this disclosure contemplates the heat exchanger device 160 comprising any suitable device that falls within the spirit and scope of the principles of this disclosure.

Figure 2:
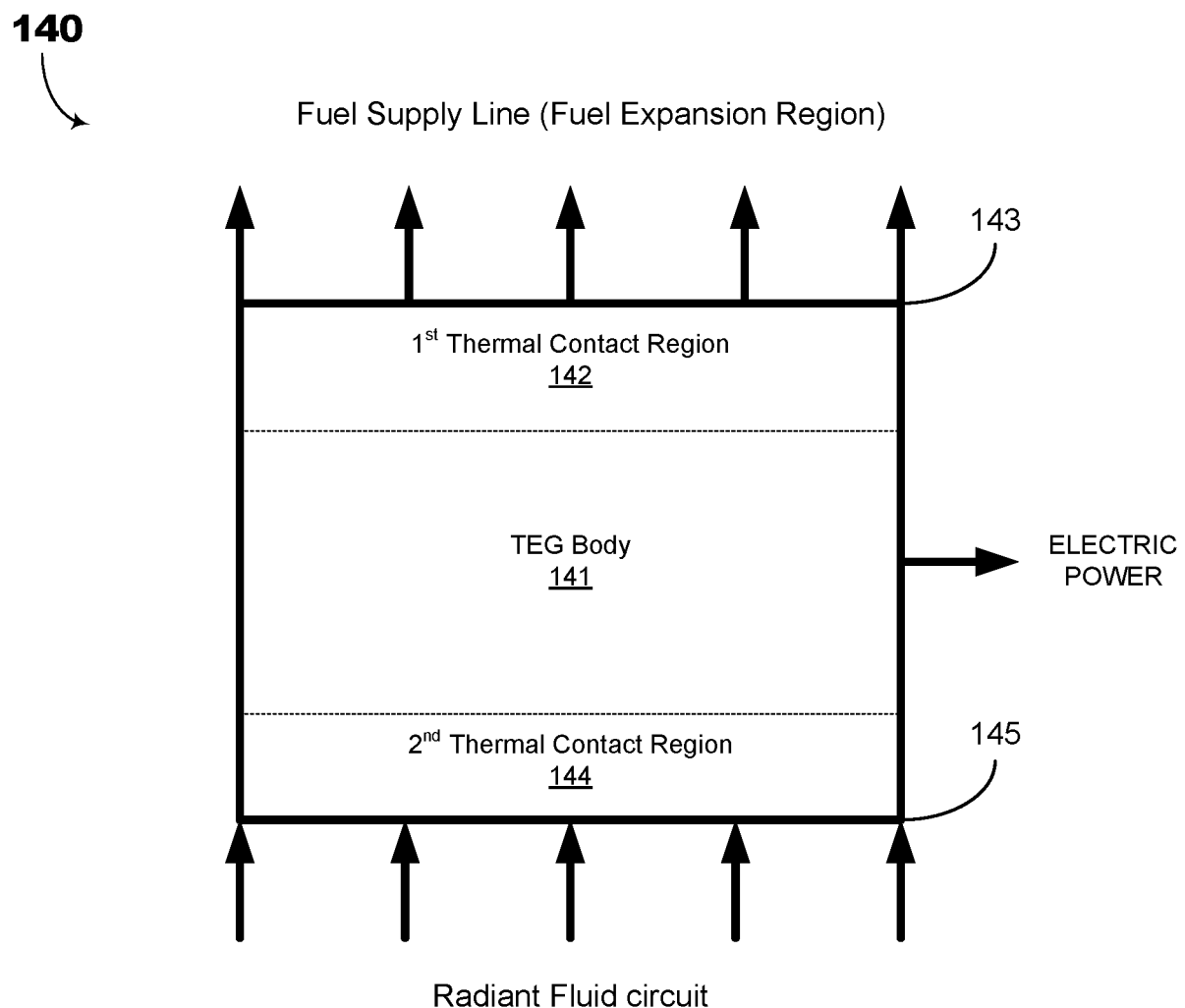
FIG. 2 illustrates a thermoelectric generator for the power generation system of FIG. 1, in accordance with one or more embodiments shown and described herein.

In the illustrated example embodiment of FIG. 2, the one or more TEGs 140 are in thermal contact with the fuel expansion region 131 (and thus, the hydrogen fuel flowing therethrough) and the radiant fluid circuit 150 (and thus, the radiant fluid flowing therethrough) downstream of the fuel cell 110 to generate electric power via a Seebeck effect using at least a portion of the waste heat generated by the fuel cell 110 that is absorbed by the radiant fluid. In this way, the one or more TEGs 140 serve to increase the overall operational efficiency of the power generation system 100. In accordance with one or more embodiments set forth, described, and/or illustrated herein, each TEG 140 comprises a Peltier generator. Embodiments, however, are not limited thereto, and thus, this disclosure contemplates each TEG 140 comprising any suitable solid state thermoelectric generator that converts a heat flux directly into electric energy.

In accordance with one or more embodiments set forth, described, and/or illustrated herein, each TEG 140 comprises a thermally conductive body 141 composed of one or more thermally conductive materials. The thermally conductive body 141 has a first thermal contact region 142 representing a cold side heat exchanger of the TEG 140, and which includes a first thermal interface or surface 143 in thermal contact with a heat sink, particularly, the fuel expansion region 131 (and thus, the hydrogen fuel flowing therethrough). At the first thermal interface or surface 143, heat is transmitted to the incoming hydrogen fuel at the fuel expansion region 131 during a phase change of the hydrogen fuel (i.e., from L2G or LP2HP hydrogen conversion).

The thermally conductive body 141 also has a second thermal contact region 144 representing a hot side heat exchanger of the TEG 140, and which includes a second thermal interface or surface 145 in thermal contact with a heat source, particularly, the radiant fluid circuit at the fluid outlet of the fuel cell 110 (and thus, the radiant fluid flowing therethrough). At the second thermal interface or surface 145, at least a portion of waste heat from the fuel cell 110 that is absorbed by the radiant fluid is in turn absorbed by the TEG 140. Concurrently with the generation of electric power by the fuel cell 110, the TEGs 140 generate electric power in response to a heat flux (temperature gradient ($\Delta T$)) across each thermally conductive body 141 (i.e., between the first thermal contact region 142 and the second thermal contact region 144). This supplemental electric power may be supplied to one or more external electrical devices electrically coupled to the system 100.

Figure 3:
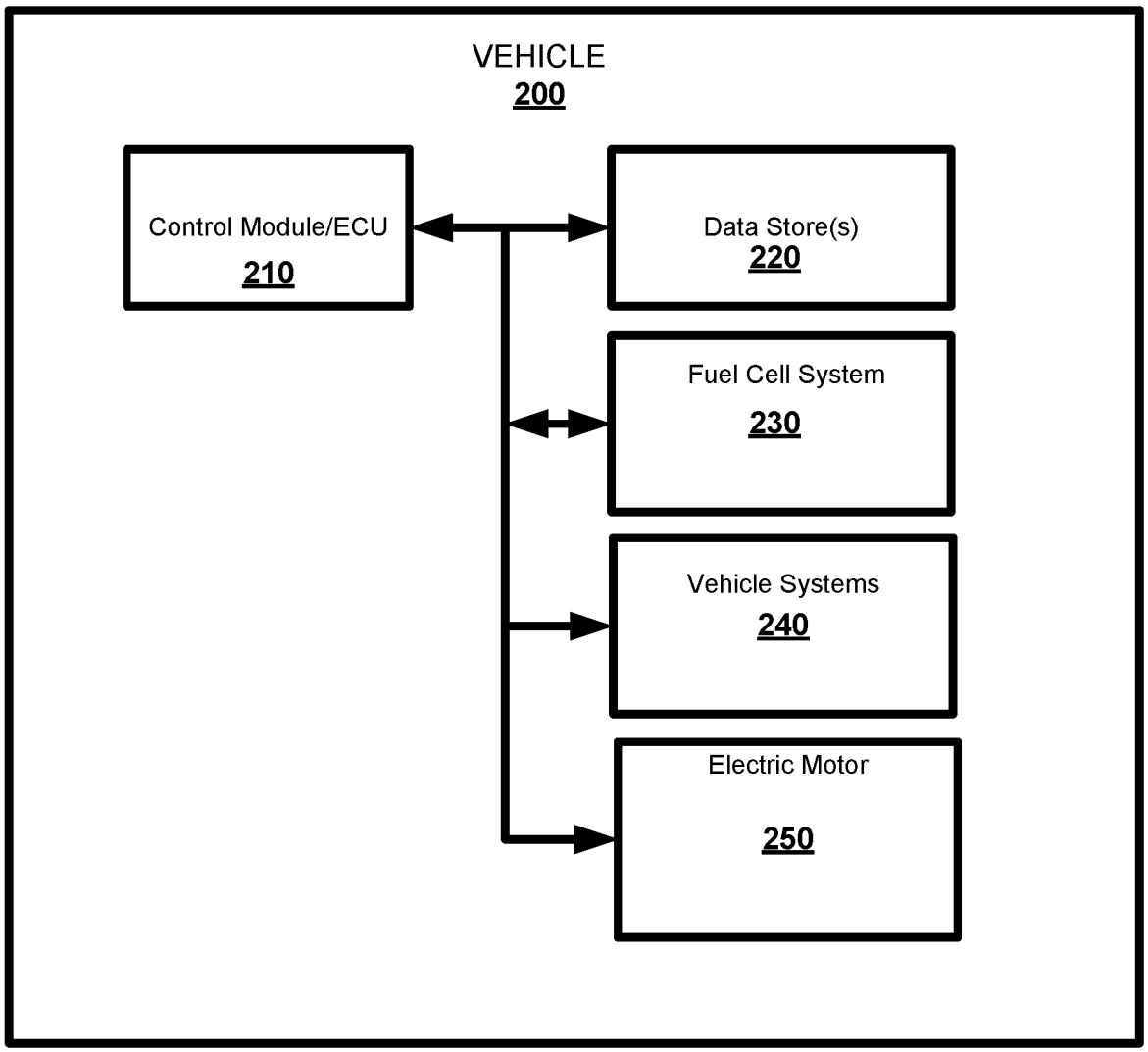
FIG. 3 illustrates an implementation of a power generation system in a vehicle, in accordance with one or more embodiments.

FIG. 3 illustrates an example vehicle 200 in accordance with one or more embodiments set forth, described, and/or illustrated herein. The vehicle 200 may comprise a mobility-as-a-service (MaaS) vehicle, a car, a truck, a van, a sport utility vehicle, a bus, a robo-taxi, etc. Embodiments, however, are not limited thereto, and thus, this disclosure contemplates the vehicle 200 comprising any suitable vehicle that falls within the spirit and scope of the principles of this disclosure. The example vehicle 200 comprises a control module/electronic control unit (ECU) 210, one or more data stores 220, the system 230, vehicle systems 240, and an electric motor 250 to drive the vehicle 200 and to which receives electric power from the system 230.

The control module/ECU 210 serves as a host, main, or primary control system of the vehicle 200. For example, the control module/ECU 210 may comprise an electronic or engine control unit (ECU) that controls the system 230. For example, the control module/ECU 210 may control and thermally manage operation of the one or more TEGs 140. The control module/ECU 210 may comprise one or more processors. As set forth, described, and/or illustrated herein, "processor" means any component or group of components that are configured to execute any of the processes described herein or any form of instructions to carry out such processes or cause such processes to be performed. The processors may be implemented with one or more general-purpose and/or one or more special-purpose processors. Examples of suitable processors include graphics processors, microprocessors, microcontrollers, DSP processors, and other circuitry that may execute software (e.g., stored on a non-transitory computer-readable medium). Further examples of suitable processors include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller. The processors may comprise at least one hardware circuit (e.g., an integrated circuit) configured to carry out instructions contained in program code. In embodiments in which there is a plurality of processors, such processors may work independently from each other, or one or more processors may work in combination with each other.

In accordance with one or more embodiments, operation of the control module/ECU 210 may be implemented as computer readable program code that, when executed by a processor, implement one or more of the various processes set forth, described, and/or illustrated herein. The control module/ECU 210 may be a component of the processors, or alternatively, may be executed on and/or distributed among other processing systems to which the processors are operatively connected. The control module/ECU 210 may include a set of logic instructions executable by the processors. Alternatively or additionally, the one or more data stores 220 may contain such logic instructions. The logic instructions may include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

The one or more data stores 220 are configured to store one or more types of data. The vehicle 200 may include interfaces that enable one or more systems thereof to manage, retrieve, modify, add, or delete, the data stored in the data stores 220. The one or more data stores 220 may comprise volatile and/or non-volatile memory. Examples of suitable data stores 220 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The one or more data stores 220 may be a component of the processors of the control module/ECU 210, or alternatively, may be operatively connected to the processors for use thereby. As set forth, described, and/or illustrated herein, "operatively connected" may include direct or indirect connections, including connections without direct physical contact.

For sake of brevity, the system 230 incorporates the structural and functional architecture set forth in the example system 100 set forth, described, and/or illustrated herein.

The one or more vehicle systems 240 may comprise various operational systems and subsystems of the vehicle 200. Such systems and subsystems include, but are not limited to an HVAC system, a windows system, battery system, a sound system, a lighting system, a drive train system, a braking system, a steering system, a throttle system, a transmission system, a signaling system, and a navigation system. Embodiments, however, are not limited thereto, and thus, the vehicle 200 may comprise more, fewer or different systems and subsystems. Electric power generated by one or more TEGs of the system 230 may be supplied to one or more of the vehicle systems 240.

Figure 4:
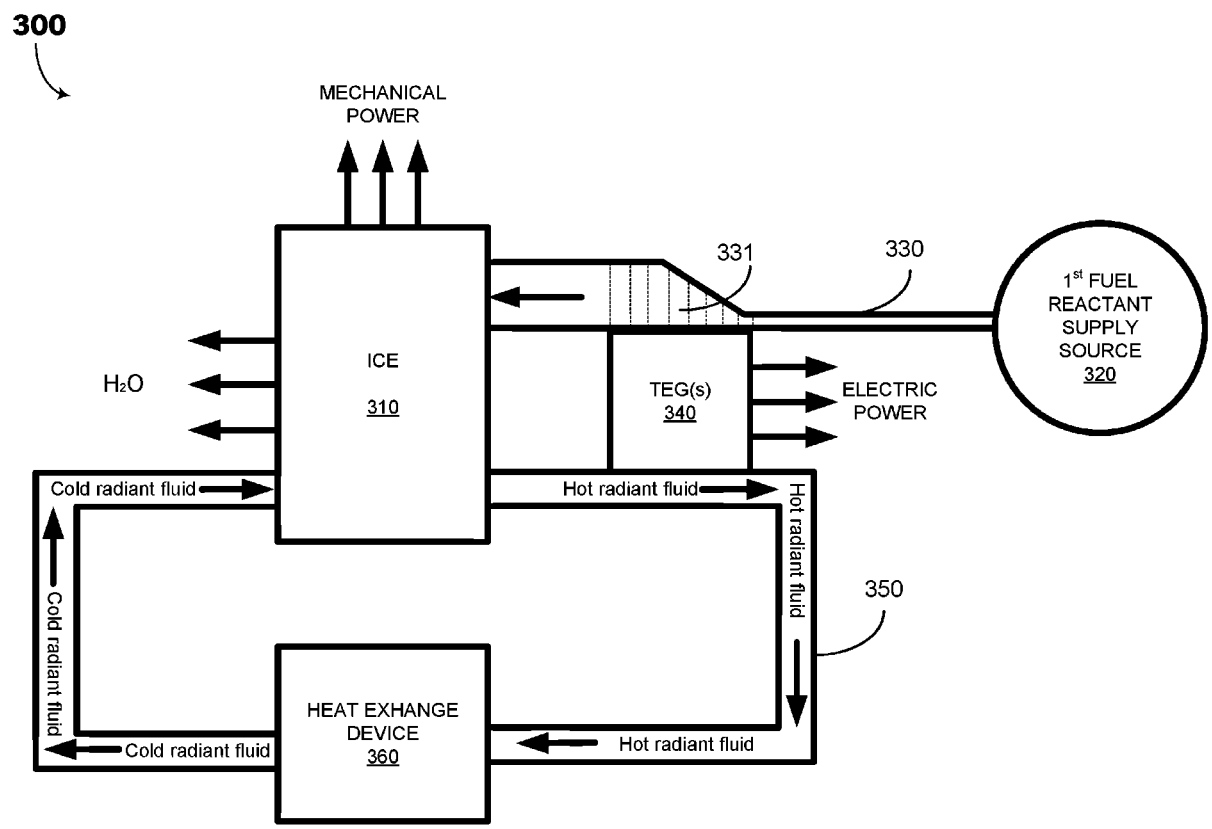
FIG. 4 illustrates a power generation system, in accordance with one or more embodiments shown and described herein.

FIG. 4 illustrates an example power generation system 300 in accordance with one or more embodiments set forth, described, and/or illustrated herein. The illustrated example system 300 may have applications in an ICE that uses hydrogen-based fuel, such as, for example, a gasoline engine, a diesel engine, and a hydrogen engine. Although the system 300 in accordance with embodiments may be implemented for mobility applications, embodiments are not limited thereto, and thus, this disclosure contemplates that the system 300 may be implemented in non-mobility or stationary applications.

The example power generation system 300 comprises an ICE 310, a first fuel reactant supply source 320, and one or more TEGs 340. In accordance with one or more embodiments set forth, described, and/or illustrated herein, the ICE 310 may comprise a hydrogen-powered ICE to generate mechanical power from an electrochemical reaction of a first fuel reactant comprising hydrogen ($H_2$) and a second fuel reactant comprising oxygen ($O_2$). In operation, the first fuel reactant (via the first fuel reactant supply source 320) and the second fuel reactant (via a stream of air) are supplied to the combustion chamber of the ICE. The resultant exothermic reaction produces mechanical power to be supplied to a vehicle drive-train.

The first fuel reactant supply source 320 is configured to supply the hydrogen to the ICE 310 via a fuel supply line 330 having a fuel expansion region 331 (See, hatched lines). In accordance with one or more embodiments set forth, described, and/or illustrated herein, the first fuel reactant supply source 320 may comprise a hydrogen tank which stores liquid or gaseous hydrogen, and one or more controllable valves for controlling the metering of hydrogen from the hydrogen tank to the ICE 310. In accordance with one example embodiment, the fuel expansion region 331 comprises a liquid-to-gas (L2G) expansion region for expansion of liquid hydrogen to form hydrogen gas to be supplied to the ICE 310. Alternatively, in accordance with one example embodiment, the fuel expansion region 331 comprises a HP gas-to-LP gas expansion region for expansion of HP hydrogen gas to form LP hydrogen gas to be supplied to the ICE 310.

The power generation system 300 may also comprise a radiant fluid circuit 350 for circulation of a radiant fluid configured to cool the ICE 310. In the radiant fluid circuit 350, the radiant fluid downstream of the ICE 310 that has absorbed or extracted heat from the ICE 310 flows out of the ICE 310 where it flows through a heat exchanger device 360 arranged downstream of the ICE 310 and the one or more TEGs 340. The heat exchanger device 360 is configured to thermally contact the hot radiant fluid for purposes of cooling (i.e., reducing the temperature) the radiant fluid having residual waste heat not absorbed by the TEGs 340 prior to return entry into the ICE 310. In accordance with one or more embodiments set forth, described, and/or illustrated herein, the heat exchanger device 360 comprises a radiator. Embodiments, however, are not limited thereto, and thus, this disclosure contemplates the heat exchanger device 360 comprising any suitable device that falls within the spirit and scope of the principles of this disclosure.

Figure 5:
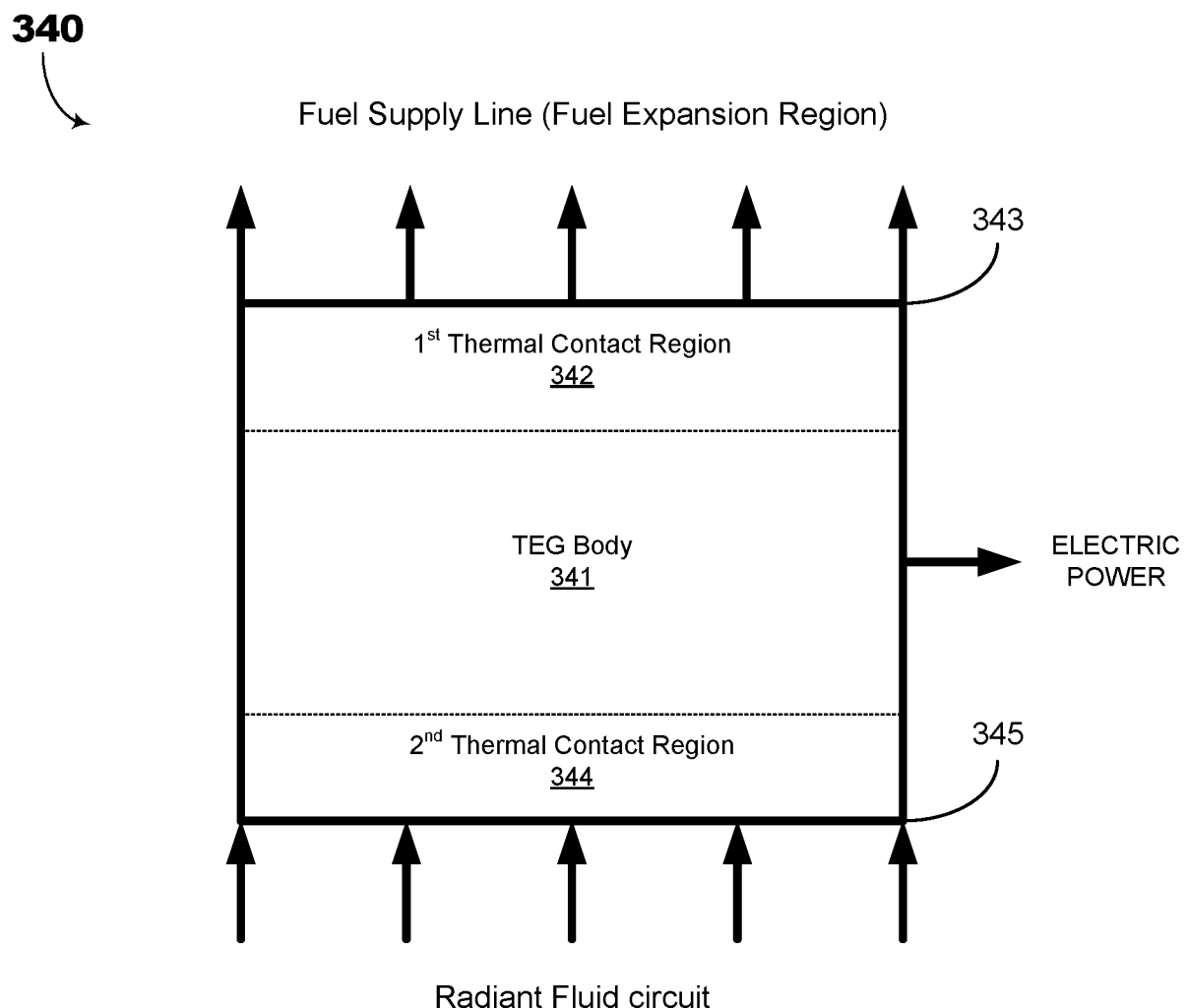
FIG. 5 illustrates a thermoelectric generator for the power generation system of FIG. 1, in accordance with one or more embodiments shown and described herein.

In the illustrated example embodiment of FIG. 5, the one or more TEGs 340 are in thermal contact with the fuel expansion region 331 (and thus, the hydrogen fuel flowing therethrough) and the radiant fluid circuit 350 (and thus, the radiant fluid flowing therethrough) downstream of the ICE 310 to concurrently generate electric power via a Seebeck effect using at least a portion of the waste heat generated by the ICE 310 that is absorbed by the radiant fluid. In this way, the one or more TEGs 340 serve to increase the overall operational efficiency of the power generation system 300. In accordance with one or more embodiments set forth, described, and/or illustrated herein, each TEG 340 comprises a Peltier generator. Embodiments, however, are not limited thereto, and thus, this disclosure contemplates each TEG 340 comprising any suitable solid state thermoelectric generator that converts a heat flux directly into electric energy.

In accordance with one or more embodiments set forth, described, and/or illustrated herein, each TEG 340 comprises a thermally conductive body 341 composed of one or more thermally conductive materials. The thermally conductive body 341 has a first thermal contact region 342 representing a cold side heat exchanger of the TEG 340, and which includes a first thermal interface or surface 343 in thermal contact with a heat sink, particularly, the fuel expansion region 331 (and thus, the hydrogen fuel flowing therethrough). At the first thermal interface or surface 343, heat is transmitted to the incoming hydrogen fuel at the fuel expansion region 331 during expansion of the hydrogen fuel (i.e., L2G or HP2LP).

The thermally conductive body 341 also has a second thermal contact region 344 representing a hot side heat exchanger of the TEG 140, and which includes a second thermal interface or surface 145 in thermal contact with a heat source, particularly, the radiant fluid circuit at the fluid outlet of the ICE 310 (and thus, the radiant fluid flowing therethrough). At the second thermal interface or surface 345, at least a portion of waste heat from the ICE 310 that is absorbed by the radiant fluid is in turn absorbed by the TEG 340. Concurrently with the generation of electric power by the ICE 310, the TEGs 340 generate electric power in response to a heat flux (temperature gradient ($\Delta T$)) across each thermally conductive body 341 (i.e., between the first thermal contact region 342 and the second thermal contact region 344). This supplemental electric power may be supplied to one or more external electrical devices electrically coupled to the power generation system 300.

Figure 6:
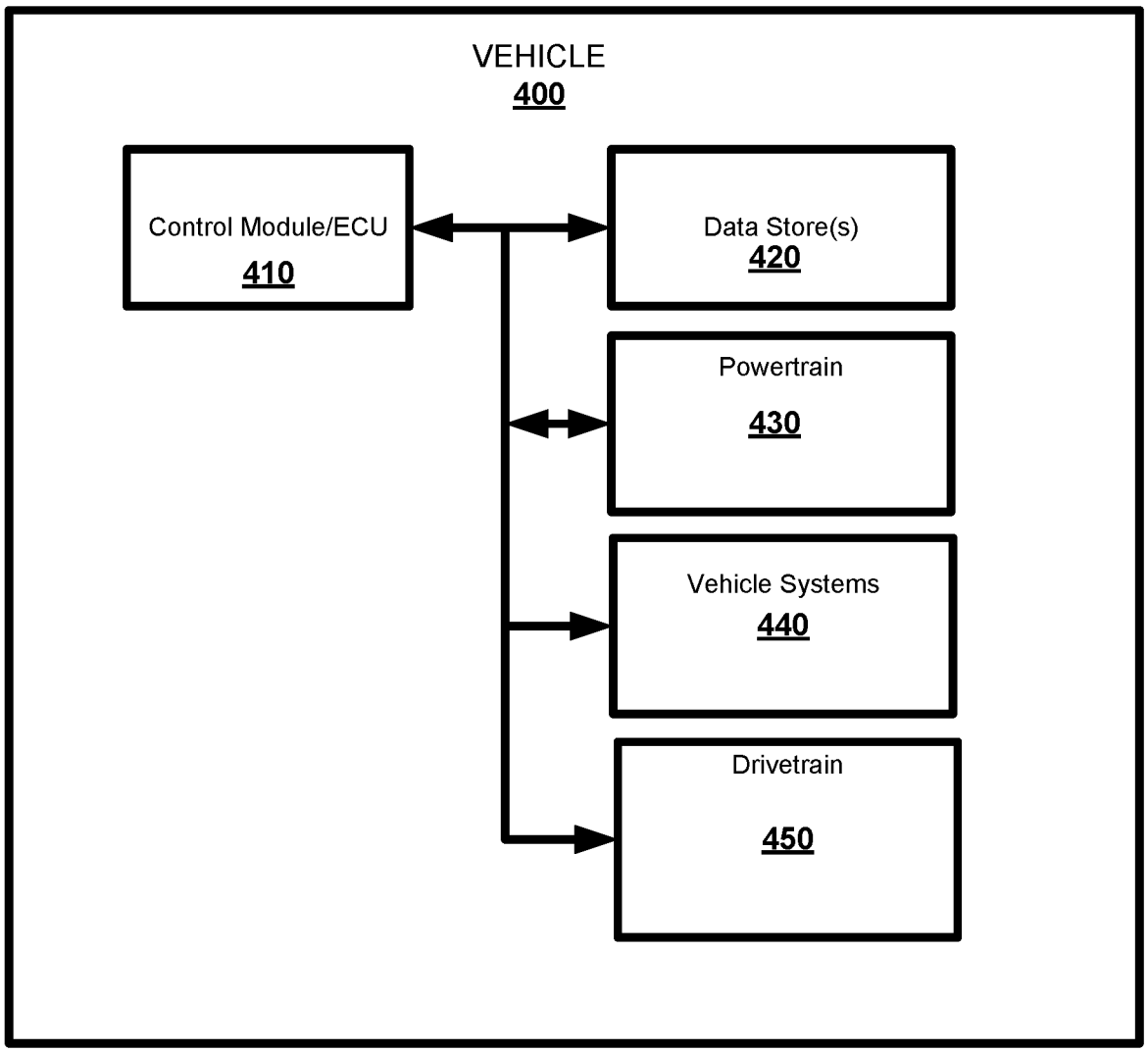
FIG. 6 illustrates an implementation of a power generation system in a vehicle, in accordance with one or more embodiments.

FIG. 6 illustrates an example vehicle 400 in accordance with one or more embodiments set forth, described, and/or illustrated herein. The vehicle 400 may comprise a mobility-as-a-service (MaaS) vehicle, a car, a truck, a van, a sport utility vehicle, a bus, a robo-taxi, etc. Embodiments, however, are not limited thereto, and thus, this disclosure contemplates the vehicle 400 comprising any suitable vehicle that falls within the spirit and scope of the principles of this disclosure. The example vehicle 200 comprises a control module/electronic control unit (ECU) 410, one or more data stores 420, a powertrain system 430 (comprising ICE 310), vehicle systems 440, and a drivetrain 450 to drive the vehicle 400 and to which receives mechanical power from the system 230.

The control module/ECU 410 serves as a host, main, or primary control system of the vehicle 400. For example, the control module/ECU 410 may comprise an electronic or engine control unit (ECU) that controls the powertrain 430. For example, the control module/ECU 410 may control and thermally manage operation of the one or more TEGs 440. The control module/ECU 410 may comprise one or more processors. As set forth, described, and/or illustrated herein, "processor" means any component or group of components that are configured to execute any of the processes described herein or any form of instructions to carry out such processes or cause such processes to be performed. The processors may be implemented with one or more general-purpose and/or one or more special-purpose processors. Examples of suitable processors include graphics processors, microprocessors, microcontrollers, DSP processors, and other circuitry that may execute software (e.g., stored on a non-transitory computer-readable medium). Further examples of suitable processors include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller. The processors may comprise at least one hardware circuit (e.g., an integrated circuit) configured to carry out instructions contained in program code. In embodiments in which there is a plurality of processors, such processors may work independently from each other, or one or more processors may work in combination with each other.

In accordance with one or more embodiments, operation of the control module/ECU 410 may be implemented as computer readable program code that, when executed by a processor, implement one or more of the various processes set forth, described, and/or illustrated herein. The control module/ECU 410 may be a component of the processors, or alternatively, may be executed on and/or distributed among other processing systems to which the processors are operatively connected. The control module/ECU 210 may include a set of logic instructions executable by the processors. Alternatively or additionally, the one or more data stores 420 may contain such logic instructions. The logic instructions may include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

The one or more data stores 420 are configured to store one or more types of data. The vehicle 400 may include interfaces that enable one or more systems thereof to manage, retrieve, modify, add, or delete, the data stored in the data stores 420. The one or more data stores 420 may comprise volatile and/or non-volatile memory. Examples of suitable data stores 420 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The one or more data stores 420 may be a component of the processors of the control module/ECU 410, or alternatively, may be operatively connected to the processors for use thereby.

For sake of brevity, the powertrain 430 incorporates the structural and functional architecture set forth in the example system 310 set forth, described, and/or illustrated herein.

The one or more vehicle systems 440 may comprise various operational systems and subsystems of the vehicle 400. Such systems and subsystems include, but are not limited to an HVAC system, a windows system, battery system, a sound system, a lighting system, a braking system, a steering system, a throttle system, a signaling system, and a navigation system. Embodiments, however, are not limited thereto, and thus, the vehicle 400 may comprise more, fewer or different systems and subsystems. Electric power generated by one or more TEGs of the system 310 may be supplied to one or more of the vehicle systems 440.

FIGS. 7 through 13 respectively illustrates a method 500 through 1100 of operating a power generation system. Each method 500 through 1100 may be implemented as one or more modules in a set of logic instructions stored in a non-transitory machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

In one or more examples, software executed by a control module/ECU provides functionality described or illustrated herein. In particular, software executed by the one or processors of the is configured to perform one or more processing blocks of the methods 500 through 1100 set forth, described, and/or illustrated herein, or provides functionality set forth, described, and/or illustrated.

Figure 7:
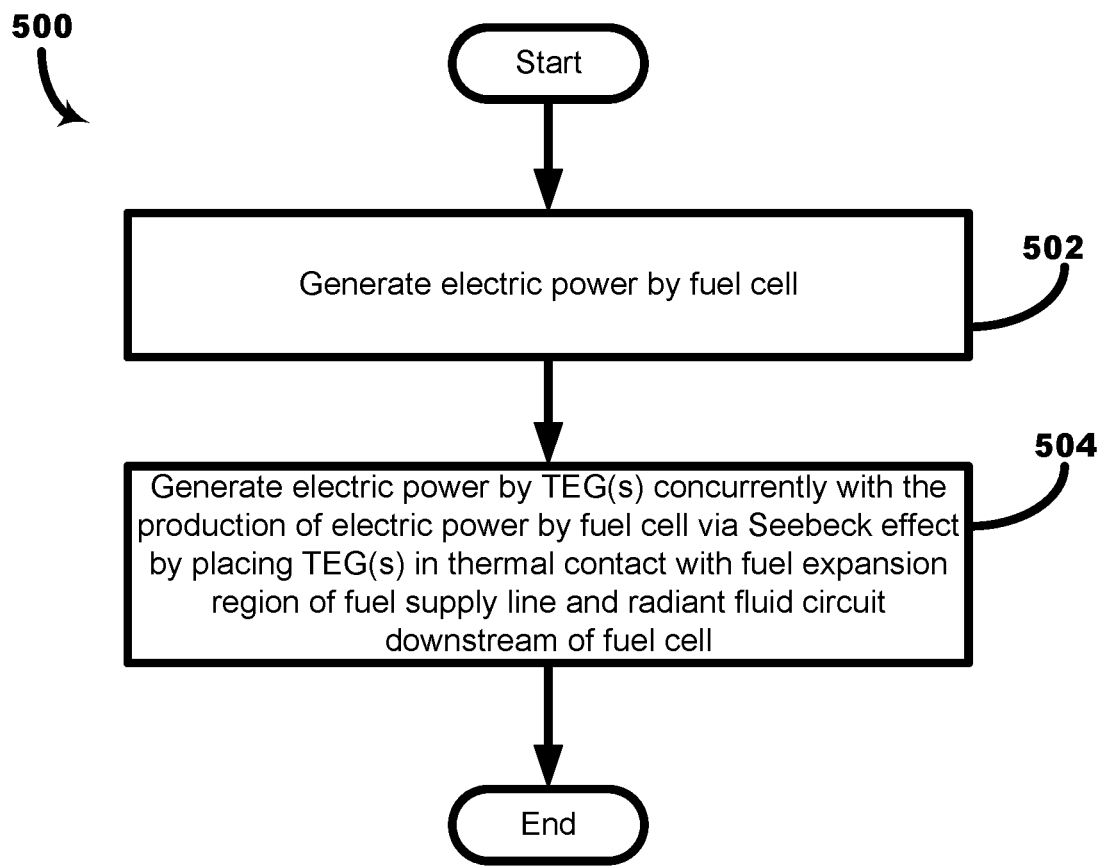
FIGS. 7 through 13 respectively illustrate a flowchart of a method of operating a power generation system, in accordance with one or more embodiments shown and described herein.

In the illustrated example of FIG. 7, illustrated block 502 includes generating electric power by a fuel cell via an electrochemical reaction of a first fuel reactant and a second fuel reactant. In accordance with the method 500, the first fuel reactant comprises hydrogen supplied by a first fuel reactant supply source (via a fuel supply line having a fuel expansion region) and the second fuel reactant comprises oxygen supplied via a stream of compressed air by a second fuel reactant supply source.

The method 500 may then proceed to illustrated process block 504, which includes generating electric power by one or more TEGs concurrently with the generation of electric power by the fuel cell via a Seebeck effect using at least a portion of the waste heat generated by waste heat generated by the fuel cell by placing the one or more TEGs in thermal contact with the fuel expansion region and a radiant fluid circuit downstream of the fuel cell. The method 500 may terminate or end after execution of process block 504.

Figure 8:
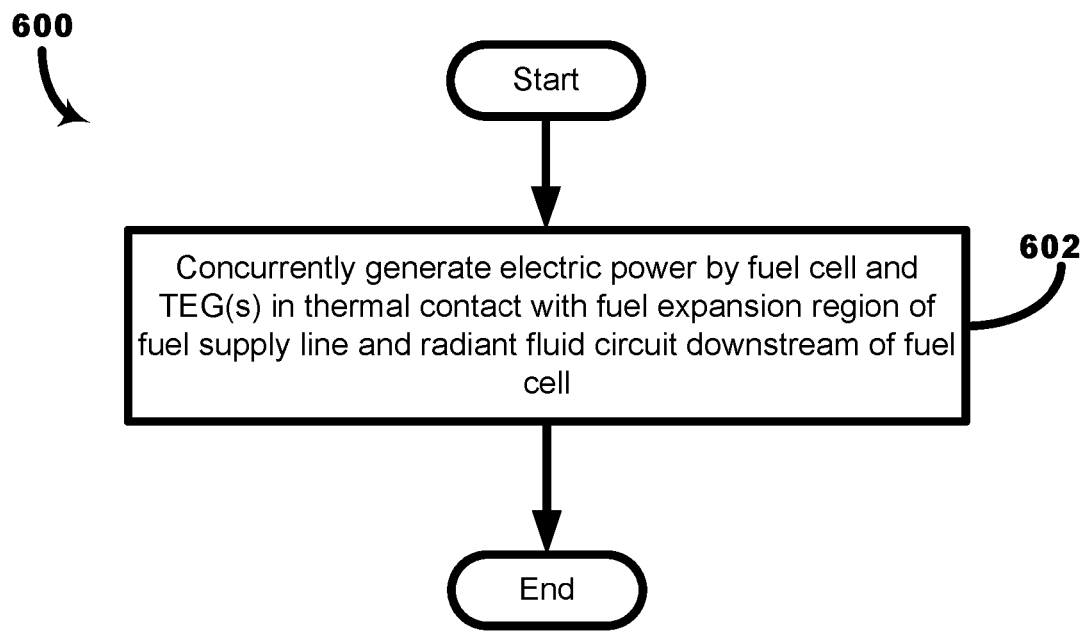

In the illustrated example of FIG. 8, illustrated block 602 includes concurrently generating electric power by a fuel cell via an electrochemical reaction of a first fuel reactant and a second fuel reactant and by one or more TEGs via a Seebeck effect using at least a portion of the waste heat generated by the fuel cell by placing one or more TEGs in thermal contact with a fuel expansion region of a fuel supply line and a radiant fluid circuit downstream of the fuel cell. In accordance with the method 600, the first fuel reactant comprises hydrogen supplied by a first fuel reactant supply source (via a fuel supply line having a fuel expansion region) and the second fuel reactant comprises oxygen supplied via a stream of compressed air by a second fuel reactant supply source. The fuel being supplied. The method 600 may terminate or end after execution of process block 602.

Figure 9:
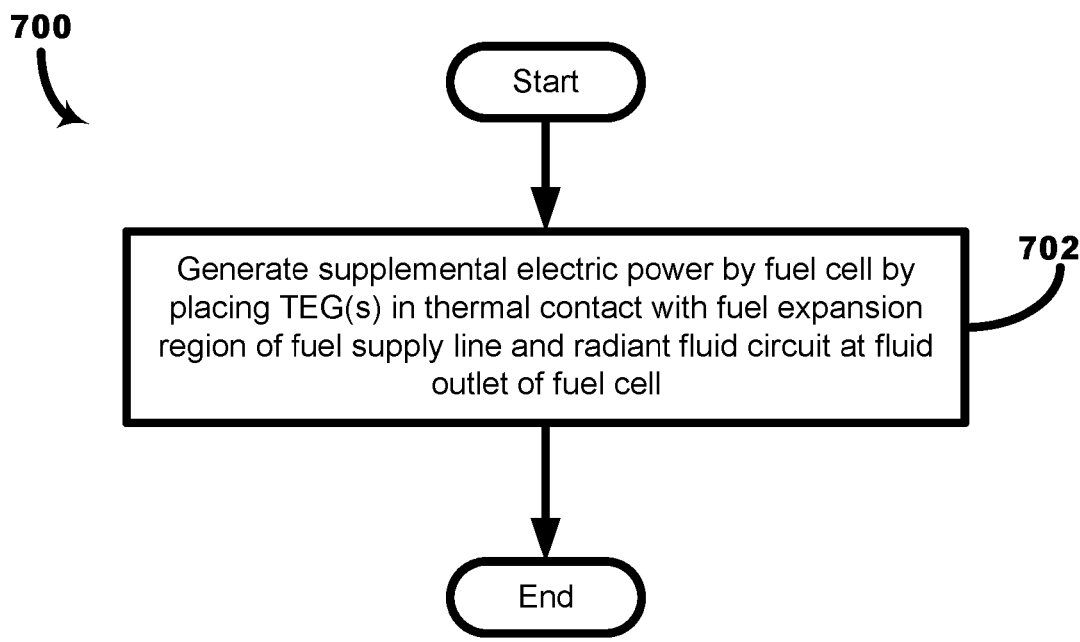

In the illustrated example of FIG. 9, illustrated block 702 includes generating supplemental electric power by a fuel cell by placing the one or more TEGs in thermal contact with a fuel expansion region of a fuel supply line and a radiant fluid circuit downstream of the fuel cell. The method 700 may terminate or end after execution of process block 702.

Figure 10:
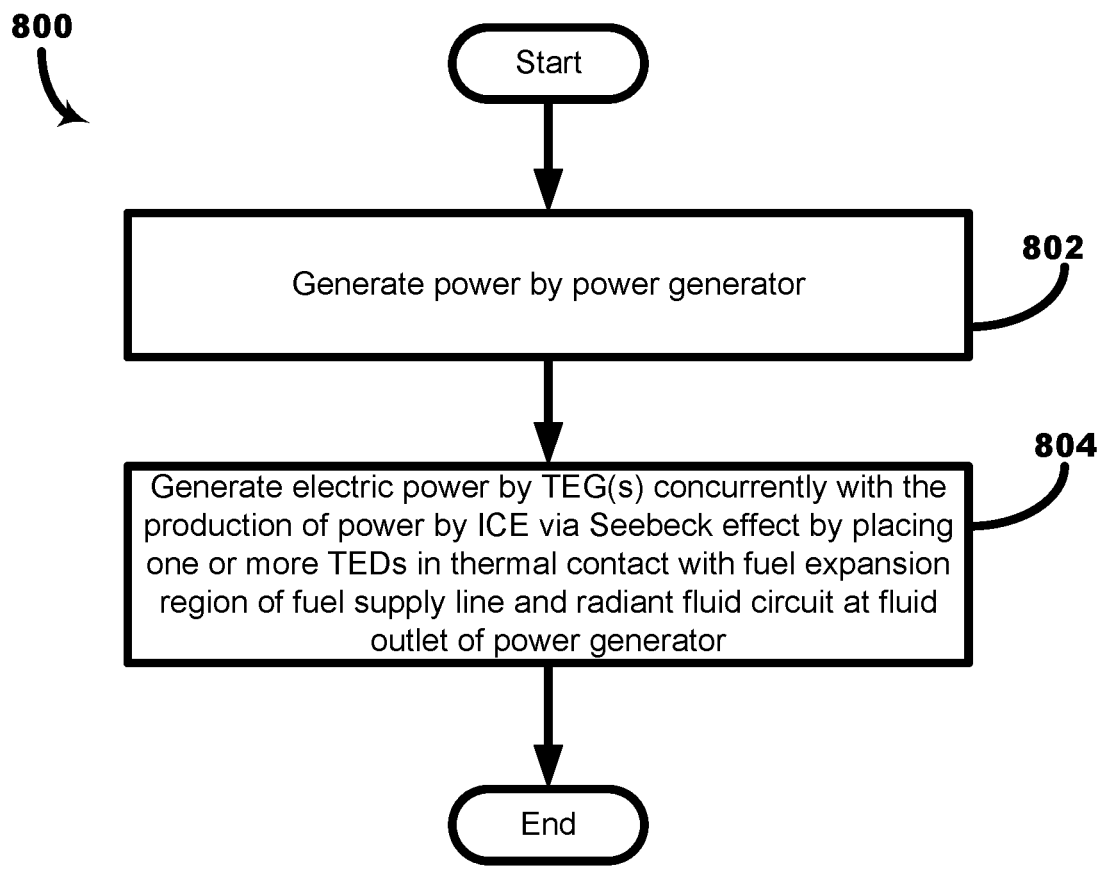

In the illustrated example of FIG. 10, illustrated block 802 includes generating power by a power generator via a reaction of a first fuel reactant and a second fuel reactant. In accordance with the method 800, the first fuel reactant comprises hydrogen supplied by a first fuel reactant supply source (via a fuel supply line having a fuel expansion region) and the second fuel reactant comprises oxygen supplied via a stream of compressed air by a second fuel reactant supply source.

The method 800 may then proceed to illustrated process block 804, which includes generating electric power by one or more TEGs concurrently with the generation of power by the power generator via a Seebeck effect using at least a portion of the waste heat generated by the power generator by placing the one or more TEGs in thermal contact with the fuel expansion region and a radiant fluid circuit downstream of the power generator. The method 800 may terminate or end after execution of process block 804.

Figure 11:
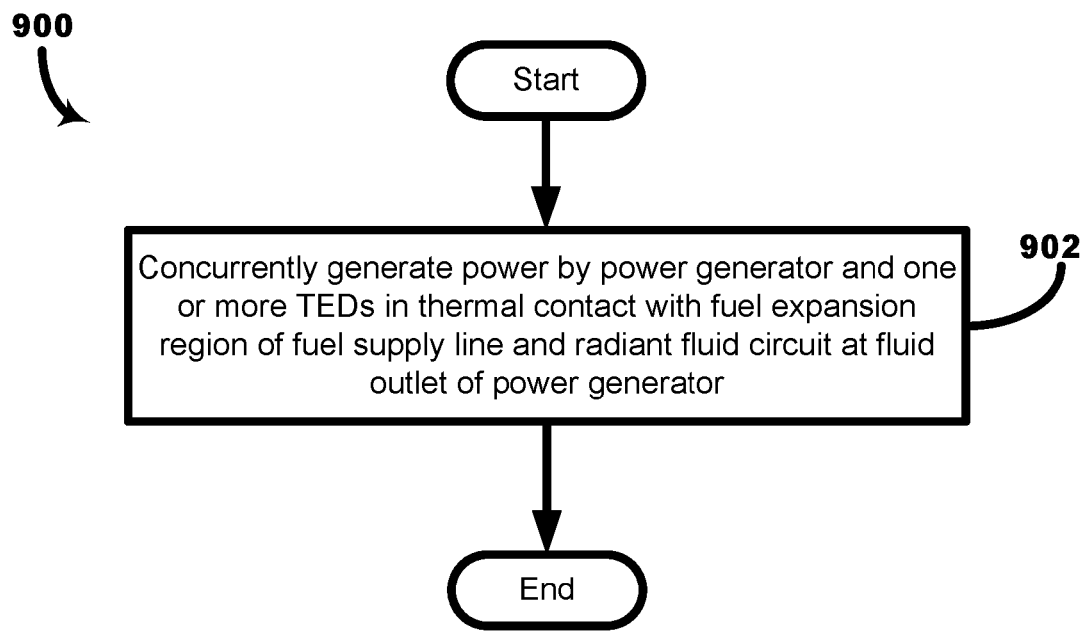

In the illustrated example of FIG. 11, illustrated block 902 includes concurrently generating electric power by a power generator via a reaction of a first fuel reactant and a second fuel reactant and by one or more TEGs via a Seebeck effect using at least a portion of the waste heat generated by the power generator by placing one or more TEGs in thermal contact with a fuel expansion region of a fuel supply line and a radiant fluid circuit downstream of the power generator. In accordance with the method 900, the first fuel reactant comprises hydrogen supplied by a first fuel reactant supply source (via a fuel supply line having a fuel expansion region) and the second fuel reactant comprises oxygen supplied via a stream of compressed air by a second fuel reactant supply source. The fuel being supplied. The method 900 may terminate or end after execution of process block 902.

Figure 12:
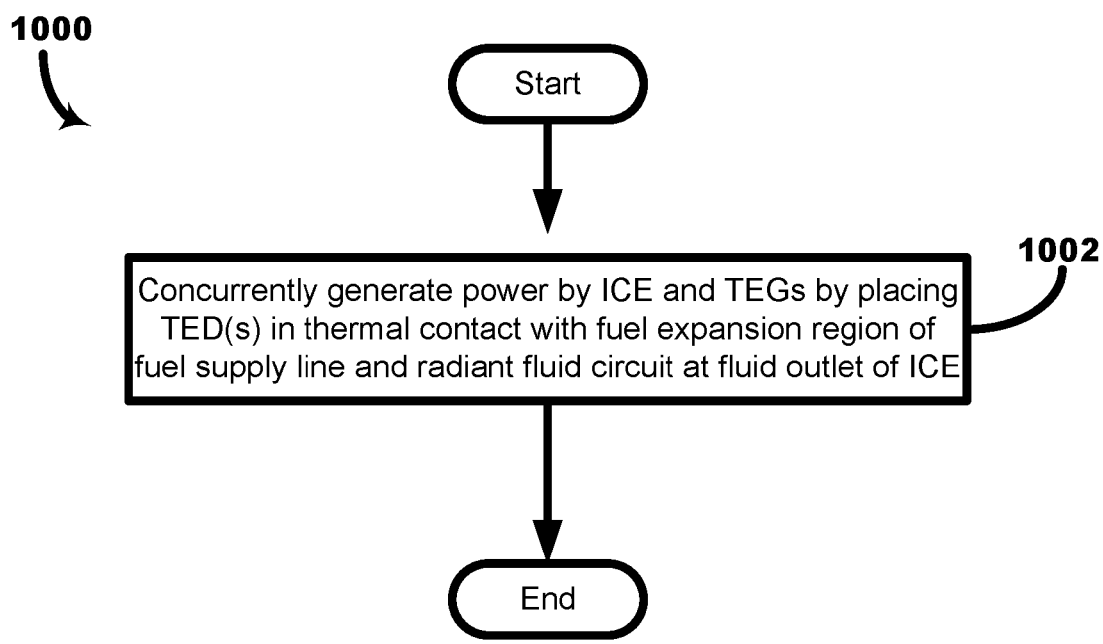

In the illustrated example of FIG. 12, illustrated block 1002 includes concurrently generating power by an ice and one or more tegs by placing the one or more tegs in thermal contact with a fuel expansion region of a fuel supply line and a radiant fluid circuit downstream of the fuel cell. The method 1000 may terminate or end after execution of process block 1002.

Figure 13:
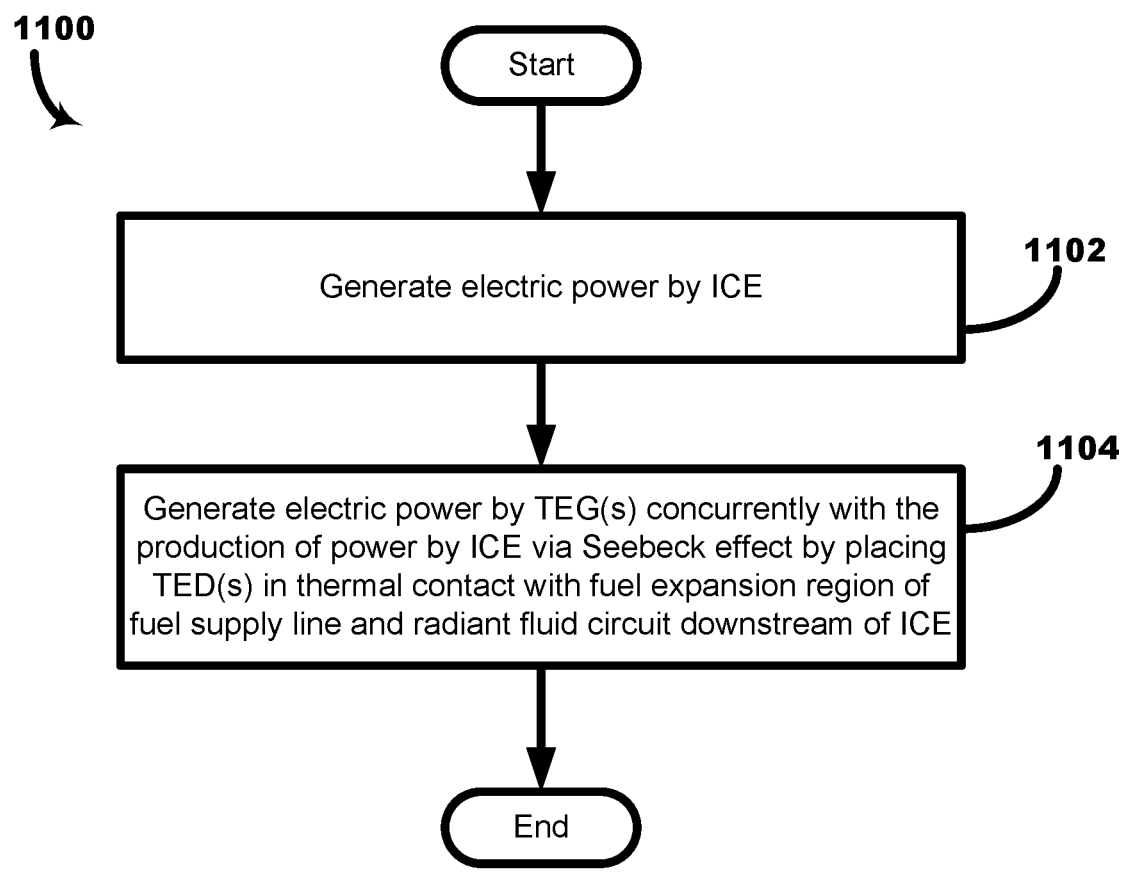

In the illustrated example of FIG. 13, illustrated block 1102 includes generating power by an ICE via a chemical reaction of a first fuel reactant and a second fuel reactant. In accordance with the method of 1100, the first fuel reactant comprises hydrogen supplied by a first fuel reactant supply source (via a fuel supply lne having a fuel expansion region) and the second fuel reactant comprises oxygen supplied via a stream of compressed air by a second fuel reactant supply source.

The method 1100 may then proceed to illustrated process block 1104, which includes generating electric power by one or more TEGs concurrently with the generation of mechanical power by the ICE via a Seebeck effect using at least a portion of the waste heat generated by the ICE by placing the one or more TEGs in thermal contact with the fuel expansion region and a radiant fluid circuit downstream of the ICE. The method 1100 may terminate or end after execution of process block 1104.

The terms "coupled," "attached," or "connected" may be used herein to refer to any type of relationship, direct or indirect, between the components in question, and may apply to electrical, mechanical, fluid, optical, electromagnetic, electromechanical or other connections. In addition, the terms "first," "second," etc. are used herein only to facilitate discussion, and carry no particular temporal or chronological significance unless otherwise indicated.

Those skilled in the art will appreciate from the foregoing description that the broad techniques of the one or more embodiments can be implemented in a variety of forms. Therefore, while the embodiments are set forth, illustrated, and/or described in connection with particular examples thereof, the true scope of the embodiments should not be so limited since other modifications will become apparent to the skilled practitioner upon a study of the drawings, specification, and claims.

What is claimed is:

1. A system, comprising:
   a power generator to generate power based on a reaction of hydrogen and a second fuel reactant;
   a fuel supply source to supply the hydrogen to the power generator via a fuel supply line having a fuel expansion region which comprises a liquid-to-gas expansion region for expansion of liquid hydrogen to hydrogen gas;
   a radiant fluid circuit for circulation of a radiant fluid configured to cool the power generator; and
   one or more thermoelectric generators in thermal contact with the fuel expansion region and the radiant fluid circuit downstream of the power generator to generate electric power via a Seebeck effect using waste heat generated by the power generator.

2. The system of claim 1, wherein each thermoelectric generator in the one or more thermoelectric generators comprises a thermoelectric body having a first thermal contact region in thermal contact with the fuel expansion region to transmit heat to the hydrogen during expansion of the hydrogen.

3. The system of claim 2, wherein each thermoelectric generator in the one or more thermoelectric generators comprises a second thermal contact region in thermal contact with the radiant fluid circuit downstream of a fuel cell to absorb waste heat from the radiant fluid.

4. The system of claim 1, wherein the fuel expansion region comprises a higher-pressure gas-to-lower-pressure gas expansion region for expansion of higher-pressure hydrogen into lower-pressure hydrogen.

5. The system of claim 1, wherein each thermoelectric generator in the one or more thermoelectric generators comprises a Peltier device.

6. A vehicle, comprising:
   a system that includes:

a power generator to generate power based on a reaction of hydrogen and a second fuel reactant;

a fuel supply source to supply the hydrogen to the power generator via a fuel supply line having a fuel expansion region which comprises a liquid-to-gas expansion region for expansion of liquid hydrogen to hydrogen gas;

a radiant fluid circuit for circulation of a radiant fluid configured to cool the power generator; and one or more thermoelectric generators in thermal contact with the fuel expansion region and the radiant fluid circuit downstream of the power generator to generate electric power via a Seebeck effect using waste heat generated by the power generator.

7. The vehicle of claim 6, wherein each thermoelectric generator in the one or more thermoelectric generators comprises a thermoelectric body having a first thermal contact region in thermal contact with the fuel expansion region to transmit heat to the hydrogen during expansion of the hydrogen.

8. The vehicle of claim 7, wherein each thermoelectric generator in the one or more thermoelectric generators comprises a second thermal contact region in thermal contact with the radiant fluid circuit downstream of a fuel cell to absorb waste heat from the radiant fluid.

9. The vehicle of claim 6, wherein the fuel expansion region comprises a higher-pressure gas-to-lower-pressure gas expansion region for expansion of higher-pressure hydrogen into lower-pressure hydrogen.

10. The vehicle of claim 6, wherein each thermoelectric generator in the one or more thermoelectric generators comprises a Peltier device.

11. A method of operating a power generation system that includes a power generator, a fuel supply source, a fuel supply line having a fuel expansion region, one or more thermoelectric generators, and a radiant fluid circuit, the method comprising:

generating power by the power generator via a reaction of a first fuel reactant and a second fuel reactant, the first fuel reactant being supplied by the fuel supply source via the fuel supply line; and generating electric power, via a Seebeck effect, using waste heat produced by the power generator by placing the one or more thermoelectric generators in thermal contact with the fuel expansion region and the radiant fluid circuit downstream of the power generator, wherein:

the first fuel reactant comprises hydrogen, and the fuel expansion region comprises a liquid-to-gas expansion region for expansion of liquid hydrogen to hydrogen gas.

12. The method of claim 11, wherein generating electric power comprises placing a first thermal contact region of the one or more thermoelectric generators in thermal contact with the fuel expansion region to transmit heat to the hydrogen during expansion of the hydrogen.

13. The method of claim 12, wherein generating electric power comprises placing a second thermal contact region of the one or more thermoelectric generators in thermal contact with the radiant fluid circuit downstream of the power generator to absorb waste heat from a radiant fluid.

14. The method of claim 11, wherein:

the fuel expansion region comprises a higher-pressure gas-to-lower-pressure gas expansion region for expansion of higher-pressure hydrogen into lower-pressure hydrogen.

15. The method of claim 11, wherein each thermoelectric generator in the one or more thermoelectric generators comprises a Peltier device.

* * * * *